United States Patent [19]

Kingsley

[11] 4,319,186

[45] Mar. 9, 1982

[54] SIGNAL SENSORS

[75] Inventor: Stuart A. Kingsley, London, England

[73] Assignee: National Research Development Corporation, London, England

[21] Appl. No.: 34,666

[22] Filed: Apr. 30, 1979

[30] Foreign Application Priority Data

May 5, 1978 [GB] United Kingdom ............... 18004/78

[51] Int. Cl.³ .................... G01R 31/00; H01S 3/00; H04B 9/00
[52] U.S. Cl. ...................................... 324/96; 73/657; 332/7.51; 350/96.29; 455/610; 455/615
[58] Field of Search ............. 324/96, 71 R; 332/7.51; 73/653, 657; 455/610, 615, 616; 350/96.1, 96.13, 96.29; 367/140, 149

[56] References Cited

U.S. PATENT DOCUMENTS 4,002,896  1/1977  Davies et al. ..................... 332/7.51

Primary Examiner—Ernest F. Karlsen
Attorney, Agent, or Firm—Cushman, Darby & Cushman

[57] ABSTRACT

The presence of a signal is sensed by a signal transducer around which an optical fibre is wrapped so that the length of the fibre is modulated by any signal present. A laser supplies coherent light to one end of the fibre and a homodyne detector is provided at the other end. Discontinuities at both ends of the fibre cause multiple reflections which produce differential phase modulations of the signal. The detected signal contains a large number of frequency components and the peak frequency is related to the amplitude of the original signal. The peak frequency is indicated by a suitable filter arrangement.

6 Claims, 2 Drawing Figures

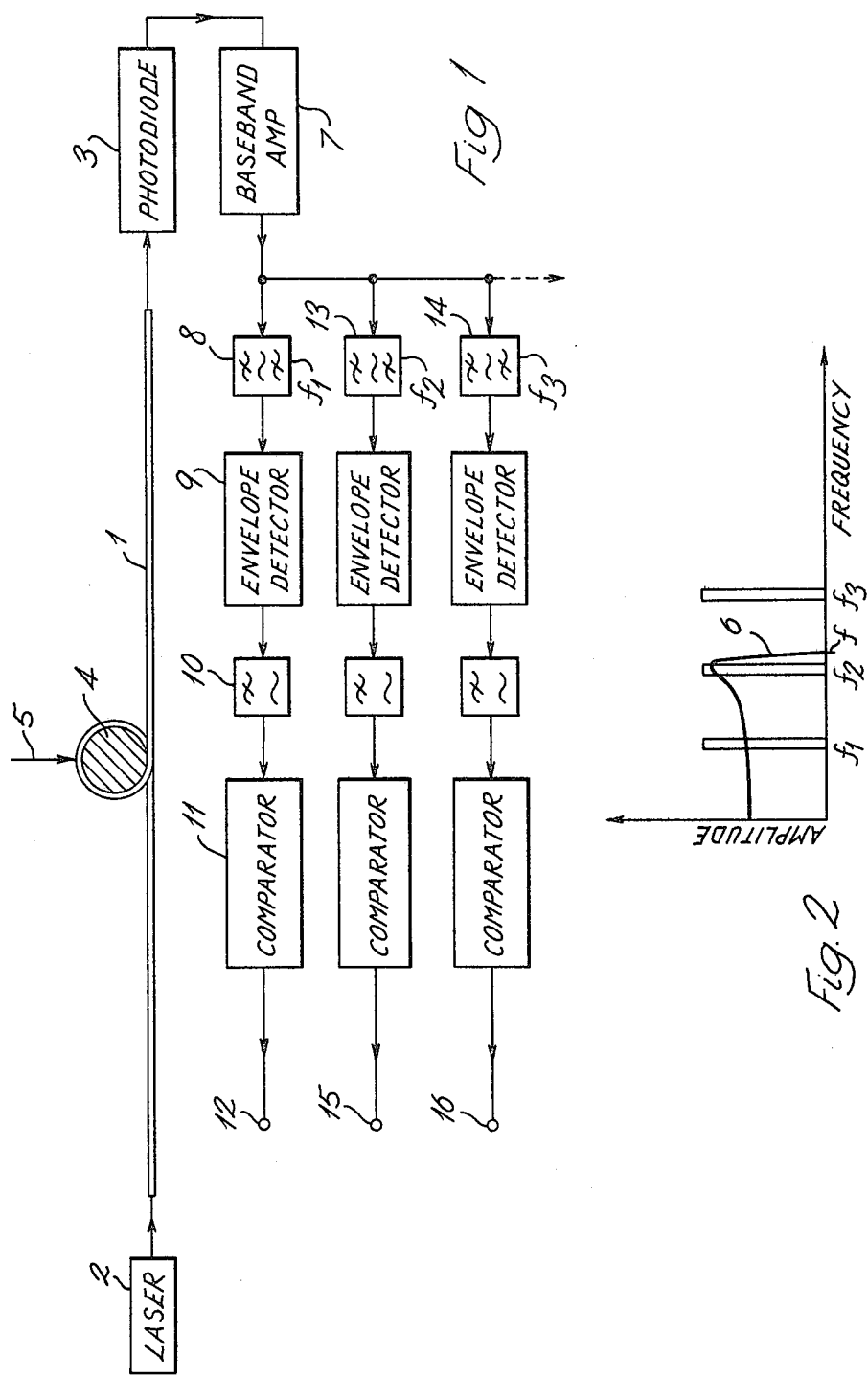

SIGNAL SENSORS

This invention relates to signal sensors. It has application in the detection of vibration and utilises the transmission properties of optical fibres for this purpose.

According to the invention a signal sensor comprises a length of optical fibre extending between a source of coherent electromagnetic radiation of optical frequency and a detector of such radiation, a transducer positioned part-way along said length of fibre to phase modulate said radiation in accordance with signals supplied to the transducer, reflector means spaced apart on opposite sides of the transducer to produce optical echo signals which combine with the initially modulated signal to produce a resultant differentially phase-modulated signal for homodyne detection in the detector, and means for indicating whether the detected signals extend to a frequency greater than a predetermined value.

Conveniently the reflector means are constituted by discontinuities present at the ends of the fibre adjacent the source and the detector respectively.

The transducer may be coupled to the fibre so as to modulate the length of the optical path thereof in accordance with the applied signal. To this end the transducer may comprise a piezo-electric element around which a number of turns of the optical fibre are wrapped.

The indicating means may comprise a base band amplifier, a filter for a frequency of predetermined value, an envelope detector and means for indicating whether the output of the envelope detector has an amplitude of above a predetermined value. The filter may comprise a narrow pass-band filter for the said frequency.

In an embodiment of the invention a plurality of filters is provided to each of which the signal from the base band amplifier is applied and each of said filters passes signals of different predetermined frequencies.

In order that the invention may be more fully understood reference will now be made to the drawing accompanying this specification, the single figure of which illustrates in diagrammatic form an embodiment thereof.

FIG. 1 is a schematic of the apparatus of the present invention.

FIG. 2 shows a graph of the frequency/amplitude curve of the detected signal.

Referring now to the Figure, there is shown therein a length 1 of optical fibre extending from a source 2 of coherent electromagnetic radiation to a detector 3 of such radiation. The fibre can be a single mode or multimode fibre. Source 2 can conveniently comprise a laser and detector 3 can be a photodiode. Positioned part-way along the length 1 of optical fibre there is provided a transducer 4. Transducer 4 can comprise a piezo-electric element in the shape of a cylinder or disc around which the optical fibre is wrapped with a number of turns. A convenient number of turns is about 30. Transducer 4 is supplied with an input signal along a line 5. This signal may be an electrical signal or alternatively the transducer 4 can be mechanically or acoustically coupled to a source of vibrations which it is desired to monitor in which case a piezo-electric element is not required.

The effect of the transducer is to modulate the overall optical path length of fibre 1 in accordance with the signals supplied to it and thus subject the radiation transmitted along the fibre to phase modulation. Due to optical discontinuities such as those at the far ends of fibre 1, namely at the interfaces between the fibre and photodiode 3 and the laser 2, a proportion of the modulated signal will be reflected back along the fibre from the end adjacent photodiode 3 to the end adjacent laser 2 and forward again from laser 2 back to photodiode 3. In each passage of the signal along the length of the fibre it will be subjected to a further phase modulation in passing transducer 4. Thus if the initial phase modulation is of magnitude $\Delta\theta$ the echo signal received at photodiode 3 after one reflection at each end of fibre 1 will be $3\Delta\theta$. The echo signal and the direct signal will thus have a differential phase modulation of $2\Delta\theta$.

It can be shown that after detection the resulting signal will contain a large number of frequency components extending from a zero value up to a maximum value f and that for a sufficiently large value of $\Delta\theta$ there will be a sharp peak followed by a cut-off at the value f. The shape of the amplitude/frequency curve of the detected signal in such a case is as shown at 6 in the Figure. Furthermore the value of the peak frequency is related to the amplitude of the input signal to the transducer in a substantially linear manner. This property forms the basis of the detecting circuit which will now be described.

The output from photodiode 3 is applied to a base band amplifier 7 and thence to a narrow band pass filter 8 which passes only a narrow range of frequencies centred on a fixed frequency f1. In order to obtain a smooth output the pass band should be broad enough to include several frequency components of the signal. The output from filter 8 is applied to an envelope detector 9 followed by a low-pass filter 10 and thence to a comparator 11 which provides an output signal only when the input therefrom from detector 9 is above a preset value. The output from comparator 11 is taken to a terminal 12. An output will thus be obtained at terminal 12 only if the value of f is greater than the value of f1 which is to say that the input signal is greater than a predetermined amplitude.

The output signal at terminal 12 can be used to provide any suitable indication that the input amplitude has exceeded a preset value.

If it is desired to provide further indications of the amplitude of the input signal then further band pass filters such as filters 13 and 14 can be provided each passing a frequency, for example f2 and f3, progressively higher than the frequency f1. The outputs from the filters 13 and 14 are applied to a similar sequence of circuits as the filter 8 and the final outputs from their associated comparators are applied to terminals 15 and 16. It will thus be seen that the amplitude of the input signal will be indicated by the number of terminals which are energised. In the particular example of the detected signal 6 the first two terminals 12 and 15 will be energised but terminal 16 will not. This shows that the amplitude of the input signal is between the amplitudes associated with the frequencies f2 and f3.

In place of the indicating circuits described above other means of indicating the amplitude/frequency curve 6 may be used, for example a spectrum analyser. Alternatively a peak frequency tracking circuit can be used with a feedback loop to cause the circuit to lock to the value of the peak frequency. This value is related in a substantially linear manner to the amplitude of the input signal.

I claim:

1. A signal sensor comprising a source of coherent electromagnetic radiation of optical frequency, a detector of such radiation, a length of optical fibre extending between the source and the detector, a transducer positioned part-way along said length of fibre to phase modulate said radiation in accordance with input signals supplied to the transducer, reflector means spaced apart on opposite sides of the transducer to produce optical echo signals which combine with the initially modulated signal to produce a resultant differentially phase-modulated signal for homodyne detection in the detector, and means for indicating the value of the peak frequency of the detected signals, said peak frequency being related to the amplitude of the said input signals.

2. The sensor as claimed in claim 1 in which the reflector means are constituted by discontinuities at the ends of the fibre adjacent the source and the detector respectively.

3. The sensor as claimed in claim 1 in which the transducer is coupled to the fibre so as to modulate the length of the optical path thereof in accordance with the applied signal.

4. The sensor as claimed in claim 3 in which the transducer comprises an element around which the optical fibre is wrapped and which expands in accordance with signals applied thereto.

5. A signal sensor comprising a source of coherent electromagnetic radiation of optical frequency, a detector of such radiation, a length of optical fibre extending between the source and the detector, a transducer coupled to said length of fibre to phase modulate said radiation in accordance with an input signal supplied to the transducer, discontinuity reflector means at opposite ends of said length of fibre providing optical echo signals in the fibre which combine with the initially modulated signal to produce a resultant differentially phase modulated signal having a frequency spectrum of width related to the amplitude of the input signal, at least one frequency selective filter to which the output of the detector is applied, and means for indicating the presence of an output from said at least one filter, the presence of such output being an indication that the amplitude of the input signal is above a level related to the frequency of the filter.

6. The sensor as claimed in claim 5 in which a plurality of filters are provided, the amplitude of the input signal being indicated by the number of filters having outputs.

* * * * *